(12) United States Patent
Imai

(10) Patent No.: US 10,996,241 B2
(45) Date of Patent: May 4, 2021

(54) PROBE CARD BOARD, PROBE CARD, AND INSPECTION APPARATUS

(71) Applicant: KYOCERA Corporation, Kyoto (JP)

(72) Inventor: Tomohiro Imai, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 46 days.

(21) Appl. No.: 16/345,965

(22) PCT Filed: Oct. 30, 2017

(86) PCT No.: PCT/JP2017/039183
§ 371 (c)(1),
(2) Date: Apr. 29, 2019

(87) PCT Pub. No.: WO2018/079788
PCT Pub. Date: May 3, 2018

(65) Prior Publication Data
US 2020/0064375 A1 Feb. 27, 2020

(30) Foreign Application Priority Data

Oct. 31, 2016 (JP) .............................. JP2016-212582

(51) Int. Cl.
*G01R 1/073* (2006.01)
*C04B 35/587* (2006.01)
(Continued)

(52) U.S. Cl.
CPC ........ *G01R 1/07314* (2013.01); *C04B 35/587* (2013.01); *C04B 35/6261* (2013.01);
(Continued)

(58) Field of Classification Search
CPC ............ G01R 1/07314; G01R 1/07371; G01R 31/2886; G01R 1/04; G01R 1/073;
(Continued)

(56) References Cited

U.S. PATENT DOCUMENTS 6,807,734 B2 10/2004 Eldridge et al.
2002/0041189 A1 4/2002 Okubo et al.
(Continued)

FOREIGN PATENT DOCUMENTS

CN 1699019 A 11/2005
JP 2010-150123 A 7/2010
(Continued)

*Primary Examiner* — Akm Zakaria
(74) *Attorney, Agent, or Firm* — Procopio Cory Hargreaves and Savitch LLP

(57) ABSTRACT

A probe card board in the present disclosure includes a plurality of through holes designed to receive a probe brought into contact with a measurement object. The probe card board is composed of silicon nitride based ceramics. The probe card board includes a first surface opposed to the measurement object and a second surface located opposite to the first surface. The probe card board contains a plurality of crystal phases of metal silicide. Metal constituting the metal silicide is at least one kind selected from among molybdenum, chrome, iron, nickel, manganese, vanadium, niobium, tantalum, cobalt and tungsten.

19 Claims, 4 Drawing Sheets

(51) Int. Cl.
*C04B 35/626* (2006.01)
*C04B 35/64* (2006.01)
*G01R 31/28* (2006.01)

(52) U.S. Cl.
CPC ........ *C04B 35/62655* (2013.01); *C04B 35/64* (2013.01); *G01R 1/07371* (2013.01); *G01R 31/2886* (2013.01); *C04B 2235/3206* (2013.01); *C04B 2235/3224* (2013.01); *C04B 2235/3258* (2013.01); *C04B 2235/3272* (2013.01); *C04B 2235/3873* (2013.01); *C04B 2235/5436* (2013.01); *C04B 2235/604* (2013.01); *C04B 2235/606* (2013.01); *C04B 2235/6025* (2013.01); *C04B 2235/656* (2013.01); *C04B 2235/658* (2013.01); *C04B 2235/963* (2013.01)

(58) Field of Classification Search
CPC .............. C04B 35/587; C04B 35/6261; C04B 35/62655; C04B 35/64; C04B 2235/3206; C04B 2235/3224; C04B 2235/3258; C04B 2235/3272; C04B 2235/3873; C04B 2235/5436; C04B 2235/6025; C04B 2235/604; C04B 2235/606; C04B 2235/656; C04B 2235/658; C04B 2235/963; C04B 2235/327; C04B 2235/3891; C04B 2235/3256; C04B 2235/3241; C04B 2235/3279; C04B 2235/3262; C04B 2235/3239; C04B 2235/3251; C04B 2235/3275; C04B 2235/3427; C04B 2235/5454; C04B 2235/6562; C04B 2235/6565; C04B 2235/661; C04B 35/62695; C04B 35/645; C04B 35/591; C04B 35/584

See application file for complete search history.

(56) References Cited

U.S. PATENT DOCUMENTS

| | | | |
|---|---|---|---|
| 2003/0049951 A1* | 3/2003 | Eldridge | G01R 1/07314 439/66 |
| 2005/0239380 A1 | 10/2005 | Hosaka et al. | |
| 2009/0194519 A1* | 8/2009 | Funaki | F23Q 7/001 219/270 |
| 2010/0084713 A1* | 4/2010 | Nakagawa | H01L 21/823842 257/369 |
| 2010/0130345 A1 | 5/2010 | Hara et al. | |
| 2014/0004302 A1* | 1/2014 | Miwa | C04B 41/009 428/141 |
| 2016/0351492 A1* | 12/2016 | Watanabe | G01R 31/2856 |
| 2017/0219434 A1* | 8/2017 | Udrea | H01L 27/14669 |
| 2018/0002237 A1* | 1/2018 | Aoki | H05K 1/03 |

FOREIGN PATENT DOCUMENTS

| | | |
|---|---|---|
| JP | 2011-7597 A | 1/2011 |
| JP | 2013-203633 A | 10/2013 |
| KR | 10-2002-0013377 A | 2/2002 |

* cited by examiner

PROBE CARD BOARD, PROBE CARD, AND INSPECTION APPARATUS

TECHNICAL FIELD

The present disclosure relates to a probe card board, a probe card, and an inspection apparatus.

BACKGROUND

A probe card has conventionally been used for inspecting a circuit formed on a semiconductor wafer. Patent Document 1 discloses an embodiment of the above probe card. The probe card is used by being highly accurately aligned with a circuit pattern for the semiconductor wafer that is an inspection object. Alignment is carried out with an optical alignment method using light, such as laser light. Hence, there is, for example, a demand for the probe card that does not excessively reflect light (namely, having a black color) and causes less reflection irregularity (namely, causing less color irregularity).

Patent Document 1 discloses a probe card which is a sintered body composed mainly of silicon nitride and is blackened by adding a transition metal, such as W and Mo.

RELATED ART DOCUMENT

Patent Document

Patent Document 1: Japanese Unexamined Patent Publication No. 2010-150123

SUMMARY

A probe card board in the present disclosure includes a plurality of through holes designed to receive a probe brought into contact with a measurement object. The probe card board is composed of silicon nitride based ceramics. The probe card board includes a first surface opposed to the measurement object and a second surface located opposite to the first surface. The probe card board contains a plurality of crystal phases of metal silicide. Metal constituting the metal silicide is at least one kind selected from among molybdenum, chrome, iron, nickel, manganese, vanadium, niobium, tantalum, cobalt and tungsten.

A probe card in the present disclosure includes the probe card board and a probe located at the through hole.

An inspection apparatus in the present disclosure includes the probe card.

EMBODIMENTS

Figure 1:
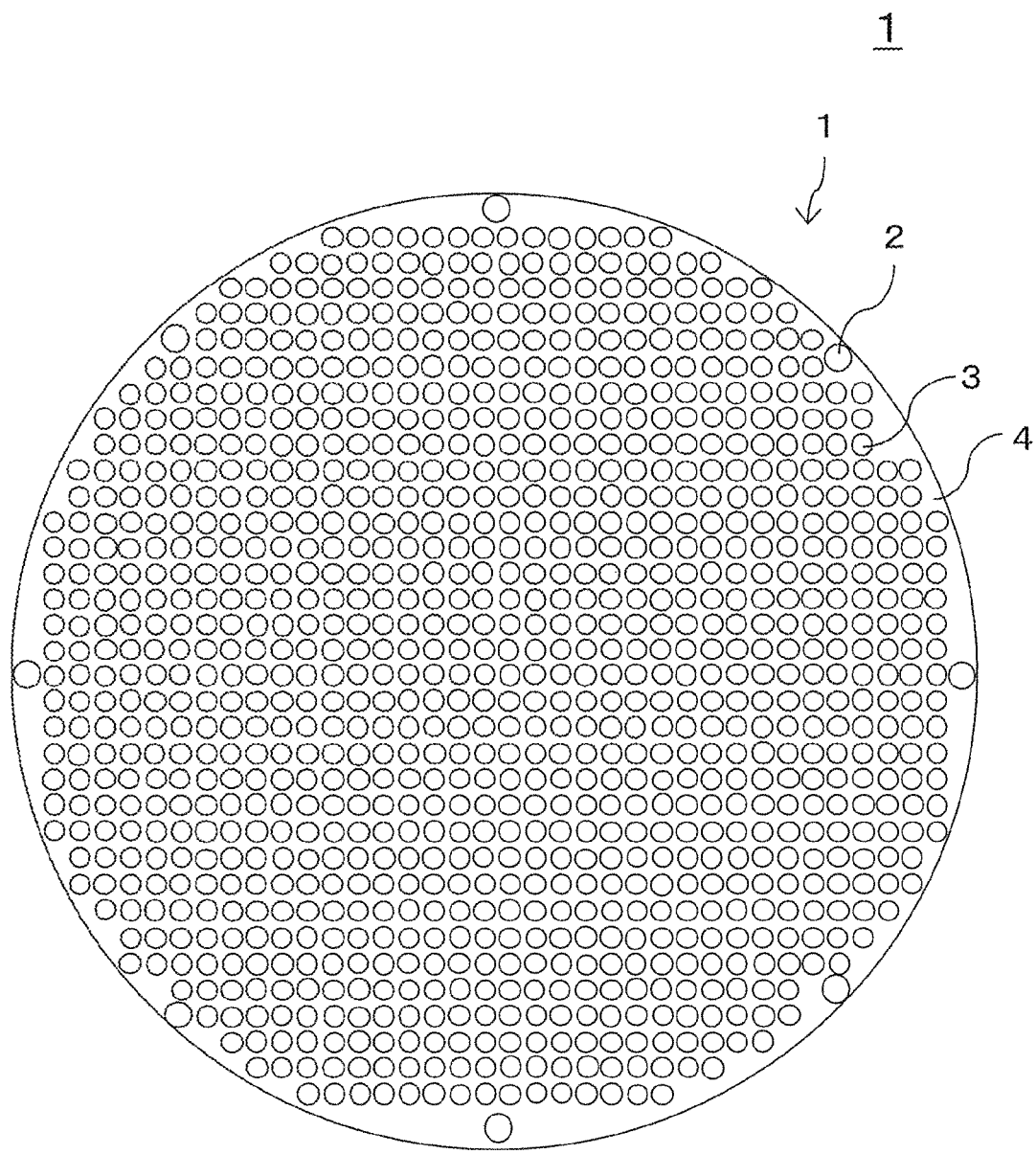
FIG. 1 is a plan view of one of embodiments of a probe card board in the present disclosure.

Embodiments of the present disclosure are described in detail below with reference to the drawings. A probe card board 1 illustrated in FIGS. 1 and 2 has a disk shape and includes an attachment hole 2 disposed in the vicinity of an outer peripheral edge, and a through hole 3 designed to receive a probe 5 brought into contact with a measurement object.

The attachment hole 2 is designed to accept insertion of a fixing member (not illustrated), such as a pin for fixing to an inspection apparatus. The through hole 3 is a hole designed to accept insertion of the probe 5 brought into contact with electric pads, such as electrodes arranged on a semiconductor chip and circuits formed on a semiconductor wafer.

Although the probe card board 1 whose outer shape is the disk shape is illustrated in the embodiments, the shape thereof is suitably changeable to, for example, a square plate shape depending on positions of the electrodes arranged on the semiconductor chip. Arrangement, number and dimension of the attachment hole 2 and the through hole 3 are also suitably changeable depending on a fixing location and the positions of the electrodes arranged on the semiconductor chip.

Figure 2:
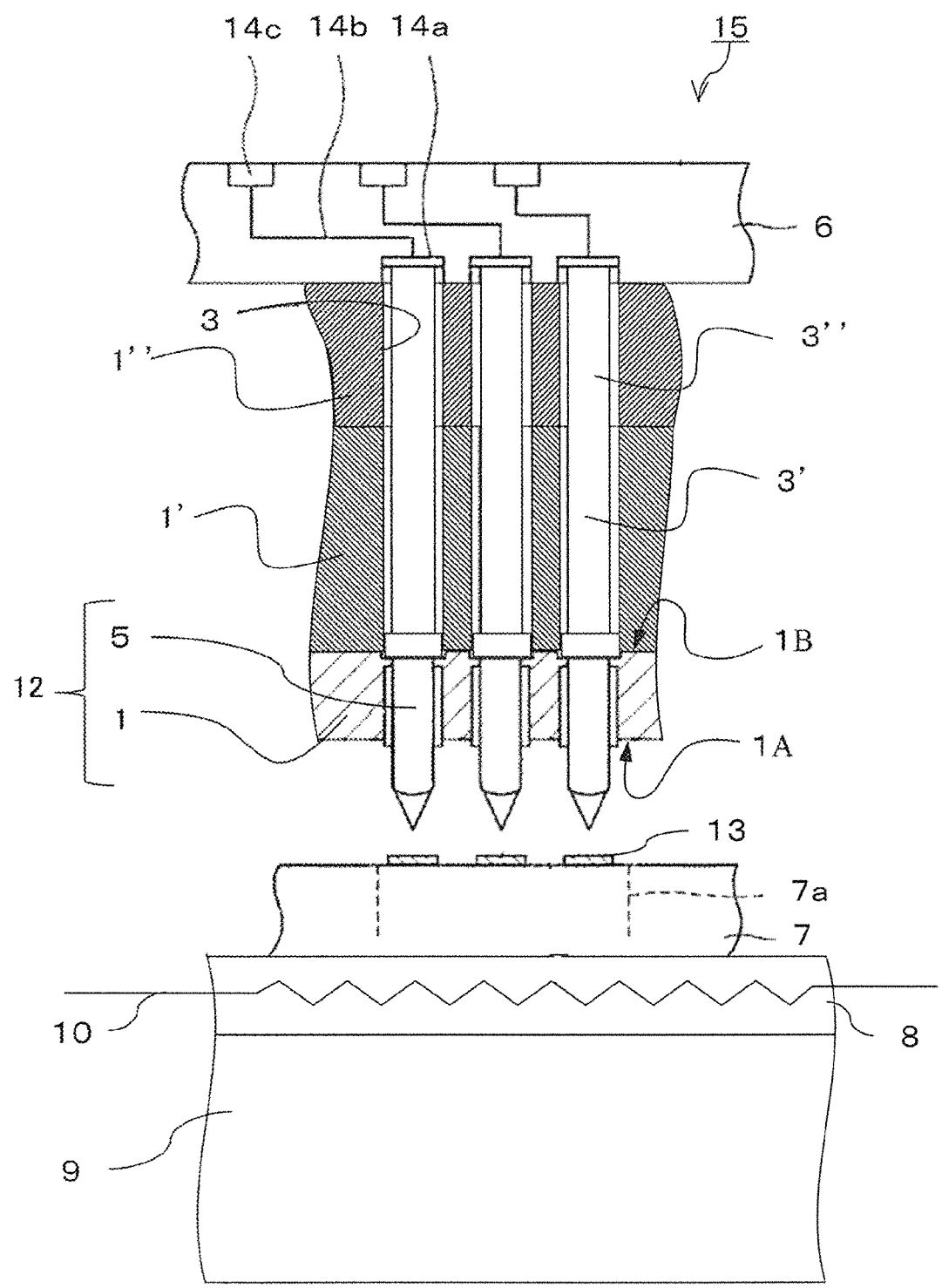
FIG. 2 is a cross-sectional view of one of embodiments of an inspection apparatus including the probe card board in the present disclosure.

The probe card board 1 is composed of silicon nitride based ceramics and includes a first surface 1A opposed to the measurement object and a second surface 1B located opposite to the first surface 1A as illustrated in FIG. 2. The probe card board 1 contains a plurality of crystal phases of metal silicide. Metal constituting the metal silicide is at least one kind selected from among molybdenum, chrome, iron, nickel, manganese, vanadium, niobium, tantalum, cobalt and tungsten. Here, the metal silicide denotes a compound constituted by metal and silicon, which is represented by MeSix (Me is a metal atom).

The crystal phase of the metal silicide has a black color in the probe card board 1. The probe card board 1 contains a plurality of crystal phases of black metal silicide. The probe card board 1 appears black as a whole, and contains a plurality of crystal phases of black metal silicide to such a degree that does not cause excessive light reflection. The metal silicide has high covalent bonding property and is chemically stable because of low reactivity with other ingredients constituting the silicon nitride based ceramics. Therefore, even when repeated such a use method as to cause a temperature rise to a somewhat higher temperature, an overall color tone of the metal silicide is less likely to change with time.

When a granular body composed of only the above metal is not exposed onto the first surface 4 in the probe card board 1, reflected light that causes noise in an optical alignment is less likely to occur. The phrase that "the granular body composed of only the above metal is not exposed onto the first surface 4" denotes that the metal contained in the silicon nitride based ceramics exists only as a crystal phase of the metal silicide.

Individual ingredients constituting the probe card board 1 can be identified using an X-ray diffraction apparatus. The silicon nitride based ceramics denotes ceramics whose silicon nitride content is 50 mass % or more relative to 100 mass % of all ingredients constituting the ceramics. The probe card board 1 may contain, for example, oxides of rare earth metal, magnesium and aluminum, besides the silicide composed of silicon nitride and the above metal. A total content of metal silicides is, for example, 0.3 mass % or more and 0.7 mass % or less in the probe card board 1.

The presence or absence of the granular body composed of only metal in the first surface 1A is checked, for example, by a surface analysis of the first surface 1A using an Electron Probe Micro Analyzer (EPMA) to check existing positions of the metal. The presence or absence of silicon (Si), oxygen (O), nitrogen (N), carbon (C), or the like, which may form a compound with the metal, at the existing position of the metal is checked by measurement with the EPMA. Unless any existing position of an ingredient that may form a compound with the metal is overlapped with the existing position of the metal, it shows that the granular body composed of only metal is present in the first surface 1A. If both are overlapped with each other, the granular body composed of only metal is not present in the first surface 1A.

The probe card board 1 may contain melilite ($Re_2Si_3O_3N_4$).

When melilite is contained in a grain boundary phase, an existing proportion of an amorphous phase composed of an oxide of an easily deformable metal element becomes relatively small in the grain boundary phase. Therefore, the grain boundary is less likely to be deformed even when exposed to high temperature, thus leading to enhanced rigidity of the probe card board 1. Melilite has a green based color. When a melilite content is 5 mass % or less, the reflected light that causes noise in the optical alignment is less likely to occur.

The melilite content needs to be found by Rietveld method using an X-ray diffraction apparatus. Contents of ingredients other than melilite can be found by an X-ray fluorescence spectrometer or an ICP (Inductively Coupled Plasma) optical emission spectrometer. A content of silicon nitride ($Si_3N_4$) and a content of an oxide of rare earth metal ($Re_2O_3$) can be found by subtracting the content of silicon nitride ($Si_3N_4$) and the content of the oxide of rare earth metal ($Re_2O_3$ Re is a rare earth metal atom).

The probe card board 1 is less prone to deterioration of dielectric strength because metal ingredients and conductive ingredients, such as water, are less likely to enter void holes existing in the first surface 1A when the void holes have a maximum length of 94 μm or less. The void holes are portions corresponding to voids in crystal particles. When the probe card board 1 itself has a high temperature and is subjected to expansion due to the presence of the void holes, squeezing force between the crystal particles can be relaxed to reduce internal stress. This leads to improved heat resistance of the probe card board 1. Because the voids in the crystal particles are observed as a white dot (white point) in appearance, the reflected light is less likely to vary in the optical alignment when a maximum length of the void holes existing in the first surface 1A is 94 μm or less.

The maximum length of the void holes is measurable with an image observed by magnifying a portion (dot region) being visible as a white dot in appearance, for example, by 100 times. More specifically, the photographed image is used to find the maximum length of the white dot by carrying out an analysis with a method called particle analysis with, for example, an image analysis software "A-ZOKUN" (registered trademark, produced by Asahi Kasei Engineering Corporation, and hereinafter, the image analysis software "A-ZOKUN" indicates the image analysis software produced by Asahi Kasei Engineering Corporation). Here, setting conditions for the particle analysis are as follows. That is, brightness is "bright," binarization method is "manual," a small figure removing area is 3 $μm^2$, and a peak value of a histogram indicating brightness of an image is 1.2 times a peak value of a histogram indicating brightness of each dot (each pixel) in the image. A noise removal filter needs to be included, and a shading size needs to be 151.

Kurtosis (Rku) of the first surface 1A which is obtainable from a roughness curve may be, for example, 2 or more and 16 or less in the probe card board of the embodiments. When the kurtosis (Rku) falls within the above range, light is less likely to be reflected from a top portion. Consequently, auto-alignment means for automatically detecting a predetermined position of a semiconductor wafer is capable of more accurately detecting the predetermined position of the semiconductor wafer.

Skewness (Rsk) obtainable from a roughness curve may be, for example, −0.9 or more and 0.8 or less in the probe card board 1. When the skewness (Rsk) falls within the above range, diffused reflection of light is less likely to occur at a mountain portion and a valley portion, and the light is therefore less likely to be reflected.

A profile section height difference (Roc) between a loading length rate of 25% and a loading length rate of 75% in the roughness curve of the first surface 1A may be 0.4 μm or more and 0.8 μm or less in the probe card board 1. When the profile section height difference (Roc) falls within the above range, a reflection rate can be lowered, and particles are less likely to be scattered.

The kurtosis (Rku) and skewness (Rsk) obtainable from the roughness curve of the first surface 1A, and the profile section height difference (Roc) between the loading length rate of 25% and the loading length rate of 75% in the roughness curve need to be found according to JIS B 0601:2001 by using a laser microscope (for example, "VK-9510" manufactured by KEYENCE CORPORATION). When using the laser microscope VK-9510, calculations need to be carried out, for example, under the following conditions. That is, a measurement mode is color super depth, a measuring magnification is 400 times, a measuring range per location is 112 μm×84 mm, a measuring pitch is 0.05 μm, a λs contour curve filter is 2.5 μm, and a λc contour curve filter is 0.08 μm.

A probe card and an inspection apparatus are described below with reference to FIG. 2. The inspection apparatus 15 illustrated in FIG. 2 includes a probe card 12, a support member 6 to support the probe card 12, a vacuum chuck 8, and a stage 9 to support the vacuum chuck 8. The vacuum chuck 8 houses therein a heater 10 to heat a semiconductor wafer 7.

The probe card 12 includes the probe card board 1 and the probe 5 disposed in the through hole 3. The probe card 12 illustrated in FIG. 2 may be a probe card laminated board in which a plurality of the probe card boards 1 (probe card boards 1, 1' and 1") are stacked one upon another. The through hole 3 communicates with through holes 3' and 3" respectively disposed on the probe card boards 1' and 1".

The support member 6 is composed of, for example, aluminum oxide based ceramics, aluminum nitride based ceramics or silicon nitride based ceramics. The support member 6 includes a pad 14a at a surface portion opposed to the probe 5 of the probe card 12. The pad 14a is electrically connected to a pad 14c formed on a surface on an opposite side with an internal circuit 14b interposed therebetween. The pads 14a and 14c are manufacturable, for example, by photolithography technique and have conductivity. A circuit 14b is composed of any one kind of, for example, Cu, Au, Al, Ni and Pb—Sn alloy.

The vacuum chuck 8 is designed to suckingly fix the semiconductor wafer 7. The inspection apparatus 15 is capable of inspecting electrical characteristics by bringing the probe 5 that is a needle-shaped contact needle into contact with the electrode pads 13 arranged on a semiconductor element 7a of the semiconductor wafer 7 in a state in which the semiconductor wafer 7 is heated to a predetermined temperature by the heater 10. The vacuum chuck 8 is intended to hold the semiconductor wafer 7 to be inspected.

Therefore, the vacuum chuck 8 may be replaced with other holding means, such as an electrostatic chuck.

In inspection using the inspection apparatus 15, the electrode pad 13 and the probe 5 need to be highly accurately aligned and brought into contact with each other. The inspection apparatus 15 includes an optical alignment mechanism (not illustrated). The alignment mechanism is used to highly accurately align the electrode pad 13 and the probe 5. The optical alignment mechanism irradiates light, such as laser, to the semiconductor wafer so as to cause reflected light and scattered light from an alignment pattern formed at a predetermined position of the semiconductor wafer, thereby measuring a position of the alignment pattern on the basis of measurement results of the reflected light and the scattered light.

The inspection apparatus 15 includes the probe card 12 including the probe card board 1. The probe card board 1 has the black color as a whole, and is designed to cause no excessive reflection of light. Even if repeated such a use method by which the probe card board 1 has high temperature to some extent, the first surface 1A is less prone to color change. The inspection apparatus 15 including the probe card 12 is therefore less prone to misalignment due to local reflection or the like in the probe card 12. The inspection apparatus 15 is also capable of keeping alignment accuracy unchanged over a relatively long period of time.

One of embodiments of a method of manufacturing a probe card board of the present embodiments is described below. Silicon nitride powder whose β-phase formation rate is 20% or less and whose purity is 98% or more, oxide powder composed of at least one kind of magnesium oxide (MgO), molybdenum, chrome, iron, nickel, manganese, vanadium, niobium, tantalum, cobalt and tungsten (hereinafter these powders are simply referred to "metal oxide powder"), and a rare earth metal oxide (for example, at least one kind from among $Sc_2O_3$, $Y_2O_3$, $La_2O_3$, $Ce_2O_3$, $Pr_6O_{11}$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$) are wet mixed together with water by using a mixing device, such as a barrel mill, a rotary mill, a vibration mill, a bead mill, a sand mill or an agitator mill. This is then pulverized to manufacture a slurry.

The silicon nitride powder is pulverized until reaching 1 μm or less in terms of particle diameter ($d_{90}$) at which a cumulative volume reaches 90% when a sum of cumulative volumes of a particle size distribution curve is 100%.

Addition amounts of the magnesium oxide, the metal oxide powder and the rare earth metal oxide powder are respectively 1 mass % or more and 2 mass % or less, 0.3 mass % or more and 0.8 mass % or less, 2 mass % or more and 4 mass % or less, and the rest is silicon nitride powder. After the meal oxide is reduced, the metal is bonded to silicon to form a silicide.

Instead of the above addition amounts of the powders, weighing may be carried out so that the magnesium oxide, the metal oxide powder, the rare earth metal oxide powder and aluminum oxide ($Al_2O_3$) powder are respectively 2 mass % or more and 6 mass % or less, 0.3 mass % or more and 0.8 mass % or less, 12 mass % or more and 16 mass % or less, 0.1 mass % or more and 0.5 mass % or less, and the rest is silicon nitride.

A maximum length of void holes (namely, white dots) existing in the probe card board is adjustable by a calcium content. Specifically, the probe card board in which the maximum length of void holes in the first surface 1A is 94 μm or less is obtainable by adding calcium powder so that the calcium content in a sintered body is 2 mass ppm or more and 100 mass ppm or less.

When the calcium content falls within the above range, the maximum length of the void holes is controllable. Meanwhile, part of calcium forms a grain boundary phase to enhance a bonding force between crystal particles of silicon nitride.

Balls used for mixing and pulverizing the silicon nitride powder and the powders of the added ingredients are preferably balls composed of a material into which impurities are less likely to enter, or a silicon nitride based sintered body having the same material composition. From the viewpoint of improving sintering properties, the silicon nitride powder and the powders of the added ingredients are preferably pulverized until reaching 3 μm or less in terms of particle diameter ($d_{90}$) at which a cumulative volume reaches 90% when a sum of cumulative volumes of a particle size distribution curve is 100%. A particle size distribution obtainable by mixing and pulverization is adjustable, for example, by an outer diameter of the balls, an amount of the balls, a viscosity of the slurry, and pulverization time.

Subsequently, an organic binder is then added to and mixed with the obtained slurry. This is then passed through a filter of a mesh whose particle size number indicated in ASTM E11-61 is 200, or a mesh being finer than the former mesh. This is then dried to obtain a granulated powder composed mainly of silicon nitride (hereinafter referred to as "silicon nitride based granulated powder"). A spray drying machine may be used for drying, and no problem occurs with any other method.

The silicon nitride based granulated powder is formed into a sheet shape by powder rolling method, thereby obtaining a ceramic green sheet. A molded body composed mainly of silicon nitride (hereinafter referred to as "a silicon nitride based molded body") is obtained by cutting the ceramic green sheet in a predetermined length. Instead of the powder rolling method, pressure molding method may be used to obtain the silicon nitride molded body by loading silicon nitride based granulated powder into a forming die, followed by pressurization.

Subsequently, the obtained silicon nitride based molded body is put in a sagger composed of a silicon nitride based sintered body whose relative density is 55% or more and 95% or less, and is fired in a firing furnace in which the black lead resistance heating body is disposed. Firing is carried out by disposing, around the silicon nitride based molded body, a coexisting material whose composition is similar to that of the silicon nitride based molded body. The coexisting material has an amount of 2 mass parts or more and less than 100 mass parts relative to 100 mass parts of the silicon nitride based molded body. The ingredients contained in the silicon nitride based molded body are consequently less likely to be volatilized.

Firing conditions are as follows. That is, temperature is raised from room temperature to 300-1000° C. in a vacuum atmosphere. Thereafter, a nitrogen partial pressure is maintained at 15-900 kPa by introducing nitrogen gas therein. By further raising temperature, the added ingredients are subjected to solid phase reaction around 1000-1400° C., thereby forming a liquid phase ingredient. A phase transition of silicon nitride from a type to β type occurs irreversibly in a temperature range of 1400° C. or above.

After this is held for 4 hours or more and 10 hours or less by setting a firing temperature to 1640° C. or above and 1750° C. or below, followed by cooling at a temperature drop rate of 170° C./time or above and 230° C./time or below, thereby obtaining silicon nitride based ceramics.

In order to obtain a crystal phase composed of metal silicide by the probe card board obtainable by polishing the silicon nitride based ceramics, a particle size ($d_{90}$), a metal oxide powder content, a firing temperature and holding time need to be respectively set to the above-mentioned ranges.

A content of melilite in the probe card board is significantly influenced by a content of rare earth metal oxide powder and a temperature drop rate. The content thereof is controllable to 5 mass % or less by setting a content of rare earth metal oxide powder and a temperature drop rate to the above-mentioned ranges.

Both main surfaces of the obtained silicon nitride based ceramics are polished by a double-side lapping machine. The material of the lapping machine needs to be cast iron, and a circumferential speed of the lapping machine needs to be suitably set in a range of 1.4 m/s or more and 2.8 m/s or less. A slurry containing diamond abrasive grains whose mean particle size ($d_{50}$) is in a range of 6 μm or more and 14 μm or less needs to be supplied during the polishing.

A rotation speed of the lapping machine and a mean particle size ($d_{50}$) of the diamond abrasive grains need to be adjusted to ensure that kurtosis (Rku) and skewness (Rsk) obtainable from the roughness curve of the first surface 4, and a profile section height difference (Roc) between a loading length rate of 25% and a loading length rate of 75% in the roughness curve fall within the above-mentioned ranges.

The probe card board of the embodiments including the attachment holes and the through holes formed thereon is obtainable by applying laser processing or machining process in a thickness direction of the polished silicon nitride based ceramics.

With the probe card board in the present disclosure, reflection is less likely to occur and overall color is less likely to be changed, and optical alignment accuracy can be suitably maintained over a relatively long period of time.

EXAMPLES

The probe card board 1 was manufactured according to the above manufacturing method. As added ingredients of silicon nitride powder, there were added 2.5 mass % of magnesium oxide powder, 0.7 mass % of tungsten oxide powder, 1.4 mass % of iron oxide powder and 14.6 mass % of erbium oxide powder.

Figure 3A:
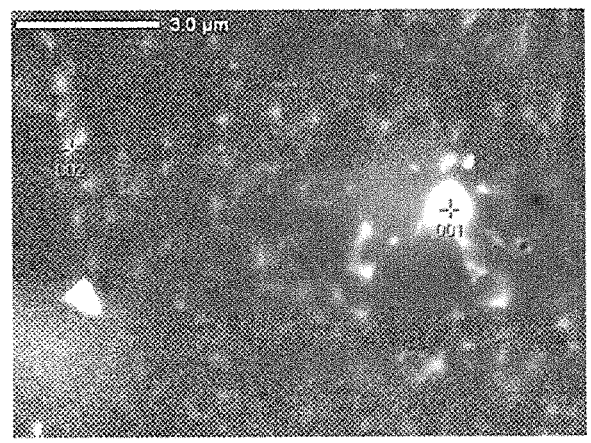
FIG. 3(a) is a backscattered electron (BEM) image obtained by photographing the probe card board under an electron microscope.
Figure 3B:
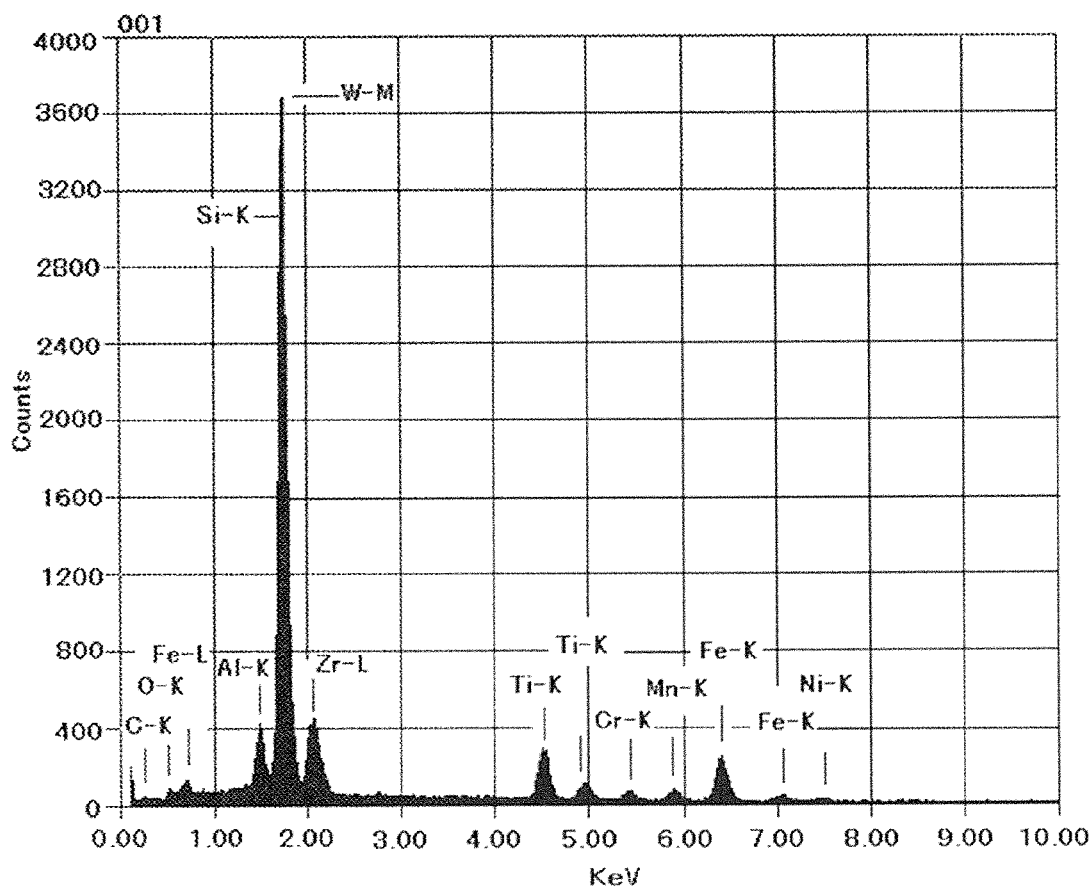
FIG. 3(b) is a result of analysis by EDS method.

FIG. 3(a) is a backscattered electron (BEM) image obtained by photographing the probe card board in the embodiments under an electron microscope. FIG. 3(b) is a result of analysis on elements existing at (001) point in FIG. 3(a) by energy-dispersive X-ray spectroscopy (EDS) method, specifically, a spectrum obtained by electron beam irradiation.

A comparison with FIG. 3(b) shows that a compound of tungsten (W) and silicon (Si), namely, a crystal phase of silicide of metal, such as tungsten, is dispersed in the probe card board 1 as represented in white color in FIG. 3(a). Although being represented in white color in the BEM image in FIG. 3(a), these metal silicides have a black color, and therefore, the probe card board 1 has a black color as a whole.

Figure 4A:
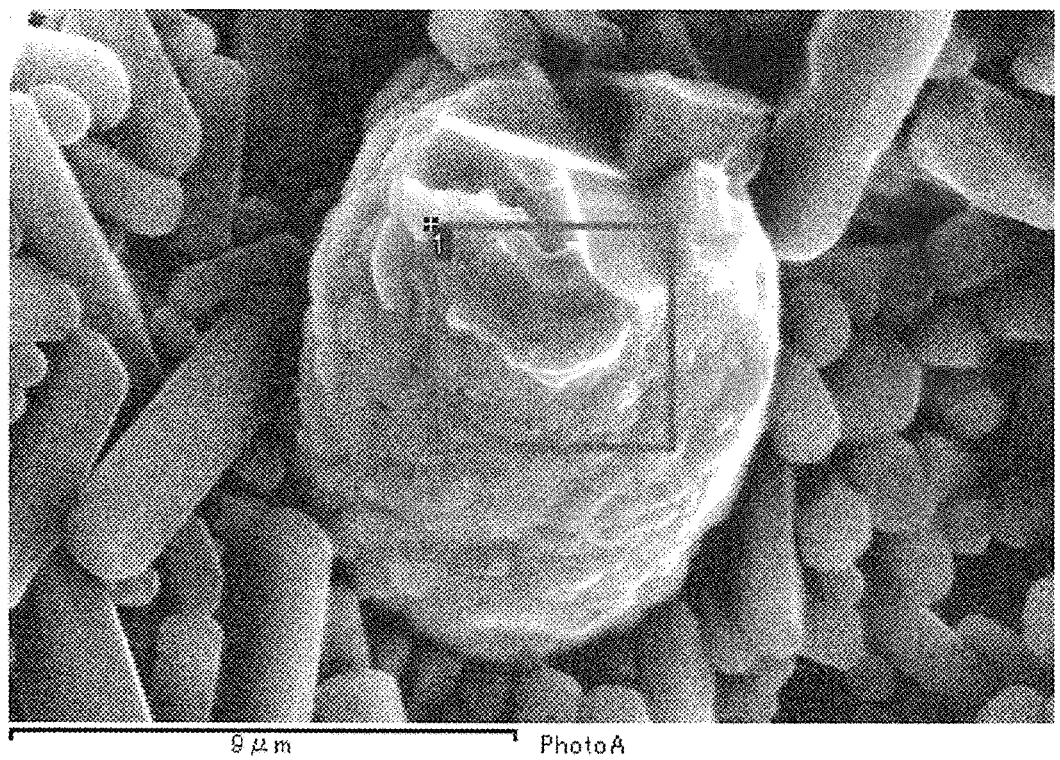
FIG. 4(a) is an electron micrograph of another location on a surface of the probe card board.
Figure 4B:
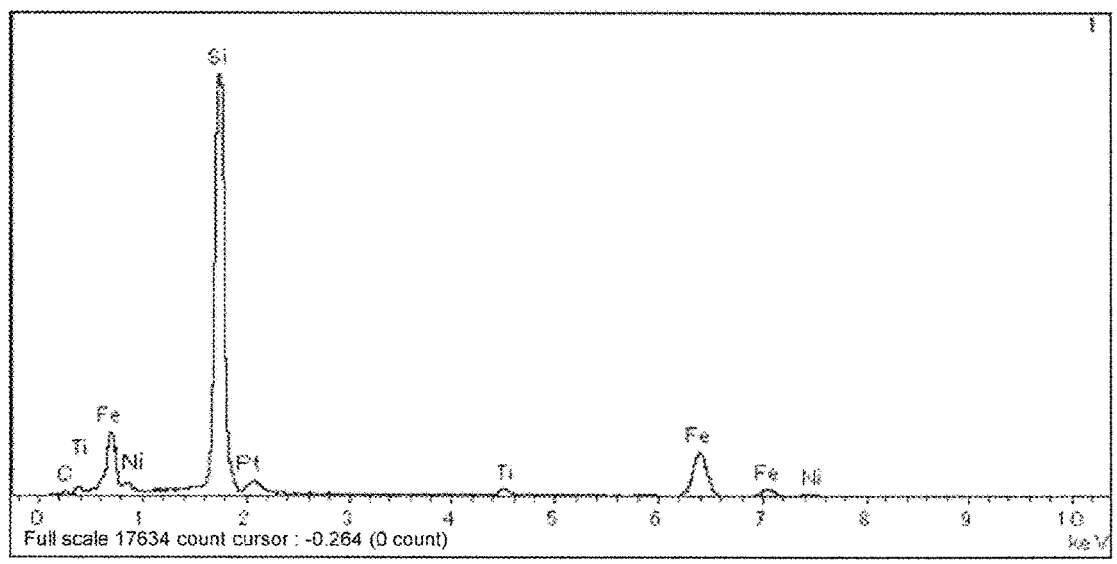
FIG. 4(b) is a result of analysis by EDS method.

FIG. 4(a) is an electron micrograph of another location of a surface of the probe card board in the embodiments. FIG. 4(b) is a result of analysis on elements existing within a square frame in FIG. 4(a) by energy-dispersive X-ray spectroscopy (EDS) method. Inspection of FIG. 4(a) shows that crystal phases different of that of silicon nitride are dispersed in a characteristic columnar crystal of silicon nitride in the probe card board 1. Inspection of FIG. 4(b) shows that these crystal phases contain much silicon (Si) and iron (Fe) and are recognizable as silicide (Si) of iron (Fe). Thus, a large amount of the crystal phases of metal silicide were dispersed in the probe card board 1.

The present disclosure is not limited to the above embodiments, and various changes and improvements can be made within the scope of claims.

DESCRIPTION OF THE REFERENCE NUMERAL 1 probe card board
1A first surface
1B second surface
2 attachment hole
3 through hole
5 probe
6 support member
8 vacuum chunk
9 stage
12 probe card

The invention claimed is:

1. A probe card board, comprising:
a plurality of through holes designed to receive a probe brought into contact with a measurement object, wherein
the probe card board further comprises ceramics with a silicon nitride content, and
a first surface opposed to the measurement object and a second surface located opposite to the first surface; and
the probe card board contains a plurality of crystal phases of metal silicide, and
a metal constituting the metal silicide is at least one kind selected from among molybdenum, chrome, iron, nickel, manganese, vanadium, niobium, tantalum, cobalt and tungsten,
wherein a profile section height difference (Roc) between a loading length rate of 25% and a loading length rate of 75% in a roughness curve on the first surface is 0.4 μm to 0.8 μm.

2. The probe card board according to claim 1, wherein a granular body composed of only metal constituting the metal silicide is not exposed onto the first surface.

3. The probe card board according to claim 1, wherein the first surface contains melilite whose content is 5 mass % or less.

4. The probe card board according to claim 1, wherein the first surface comprises void holes having a maximum length of 94 μm or less.

5. The probe card board according to claim 1, wherein the silicon nitride based ceramics contains at least 50 mass % or more of silicon nitride relative to 100 mass % of all ingredients constituting ceramics.

6. The probe card board according to claim 1, wherein kurtosis (Rku) of the first surface obtainable from a roughness curve is 2 to 16.

7. The probe card board according to claim 1, wherein skewness (Rsk) of the first surface obtainable from a roughness curve is −0.9 to 0.8.

8. The probe card board according to claim 1, wherein a crystal phase of the metal silicide is exposed onto a surface of the first surface.

9. A probe card, comprising:
the probe card board according to claim 1; and
the probe located at one of the plurality of through holes.

10. An inspection apparatus comprising the probe card according to claim 9.

11. The probe card board according to claim 2, wherein the first surface contains melilite whose content is 5 mass % or less.

12. The probe card board according to claim 11, wherein the first surface comprises void holes having a maximum length of 94 μm or less.

13. The probe card board according to claim 12, wherein the silicon nitride based ceramics contains at least 50 mass % or more of silicon nitride relative to 100 mass % of all ingredients constituting ceramics.

14. The probe card board according to claim 13, wherein kurtosis (Rku) of the first surface obtainable from a roughness curve is 2 to 16 and skewness (Rsk) of the first surface obtainable from a roughness curve is −0.9 to 0.8.

15. The probe card board according to claim 2, wherein the first surface comprises void holes having a maximum length of 94 μm or less.

16. The probe card board according to claim 15, wherein the silicon nitride based ceramics contains at least 50 mass % or more of silicon nitride relative to 100 mass % of all ingredients constituting ceramics.

17. The probe card board according to claim 16, wherein kurtosis (Rku) of the first surface obtainable from a roughness curve is 2 to 16 and skewness (Rsk) of the first surface obtainable from a roughness curve is −0.9 to 0.8.

18. The probe card board according to claim 2, wherein the silicon nitride based ceramics contains at least 50 mass % or more of silicon nitride relative to 100 mass % of all ingredients constituting ceramics.

19. The probe card board according to claim 18, wherein kurtosis (Rku) of the first surface obtainable from a roughness curve is 2 to 16 and skewness (Rsk) of the first surface obtainable from a roughness curve is −0.9 to 0.8.

\* \* \* \* \*